(12) United States Patent
Sarver

(10) Patent No.: US 6,981,594 B1
(45) Date of Patent: Jan. 3, 2006

(54) METHOD AND APPARATUS TO FACILITATE TRANSPORT OF SEMICONDUCTOR WAFERS

(75) Inventor: Roger P. Sarver, Gorham, ME (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/463,974

(22) Filed: Jun. 17, 2003

(51) Int. Cl.
   *B65D 85/00* (2006.01)
   *B65D 85/30* (2006.01)
   *A47G 19/08* (2006.01)

(52) U.S. Cl. ............... 206/710; 206/445; 206/454; 206/832; 211/41.18

(58) Field of Classification Search ........... 206/308.3, 206/445, 454, 710, 711, 832, 833; 211/41.18, 211/135, 175, 187, 190, 195, 207; 220/9.3, 220/666; 229/67.3
See application file for complete search history.

(56) References Cited

U.S. PATENT DOCUMENTS

| | | | | |
|---|---|---|---|---|
| 2,725,087 A | * | 11/1955 | Potter | 206/598 |
| 3,391,698 A | * | 7/1968 | Wiles | 220/500 |
| 4,730,727 A | * | 3/1988 | Petroff | 206/425 |
| 4,762,225 A | * | 8/1988 | Henkel | 206/308.1 |
| 4,958,728 A | * | 9/1990 | Effendi | 206/425 |
| 5,119,950 A | * | 6/1992 | Takemura | 206/425 |
| 5,255,785 A | * | 10/1993 | Mackey | 206/308.3 |
| 5,630,509 A | * | 5/1997 | Su | 206/425 |
| 6,092,981 A | * | 7/2000 | Pfeiffer et al. | 211/41.18 |
| 6,672,439 B2 | * | 1/2004 | Platte, III | 206/425 |
| 2003/0052039 A1 | * | 3/2003 | Cu, Jr. | 206/711 |

* cited by examiner

*Primary Examiner*—Mickey Yu
*Assistant Examiner*—J. Gregory Pickett
(74) *Attorney, Agent, or Firm*—Beyer Weaver & Thomas LLP

(57) ABSTRACT

An assembly to facilitate the transport of semiconductor wafers comprises rigid first and second end plates, and a plurality of interconnected flexible pockets provided between these first and second end plates. Each of the pockets is configured to store a semiconductor wafer therein.

A method of facilitating the transport of semiconductor wafers comprises inserting semiconductor wafers into pockets of a wafer transport assembly, the assembly having rigid first and second end plates, and a plurality of interconnected flexible pockets attached therebetween. The method further comprises collapsing the pockets down onto the semiconductor wafers by moving the first end plate toward the second end plate.

A method of fabricating an assembly to facilitate the transport of semiconductor wafers comprises providing a plurality of interconnected flexible pockets between rigid first and second end plates, each of these pockets being configured to store a semiconductor wafer therein.

7 Claims, 3 Drawing Sheets

METHOD AND APPARATUS TO FACILITATE TRANSPORT OF SEMICONDUCTOR WAFERS

BRIEF DESCRIPTION OF THE INVENTION

This invention relates generally to semiconductor wafer fabrication. More specifically, this invention relates to an apparatus and method for facilitating the transport of semiconductor wafers.

BACKGROUND OF THE INVENTION

Cassette carriers are often used to transport finished semiconductor wafers prior to dicing. However, these carriers suffer from certain drawbacks. Current cassette carriers maintain excessive space between wafers, taking up too much volume in transport and resulting in unnecessary expense. Current carriers also expose wafers to excessive risk of shock due to rough handling, and are relatively expensive.

Therefore, it would be highly desirable to design a more compact cassette carrier that requires less volume in transport. It would also be desirable to design this carrier to better cushion wafers from shock during transport, and to be manufactured more cheaply.

SUMMARY OF THE INVENTION

An assembly to facilitate the transport of semiconductor wafers comprises rigid first and second end plates, and a plurality of interconnected flexible pockets provided between these first and second end plates. Each of the pockets is configured to store a semiconductor wafer therein.

A method of facilitating the transport of semiconductor wafers comprises inserting semiconductor wafers into pockets of a wafer transport assembly, the assembly having rigid first and second end plates, and a plurality of interconnected flexible pockets attached therebetween. The method further comprises collapsing the pockets down onto the semiconductor wafers by moving the first end plate toward the second end plate.

A method of fabricating an assembly to facilitate the transport of semiconductor wafers comprises providing a plurality of interconnected flexible pockets between rigid first and second end plates, each of these pockets being configured to store a semiconductor wafer therein.

The various assemblies of the invention allow for more compact transport of semiconductor wafers. These assemblies can also be manufactured more cheaply than current cassette carriers, and can better cushion wafers from shock during transport.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
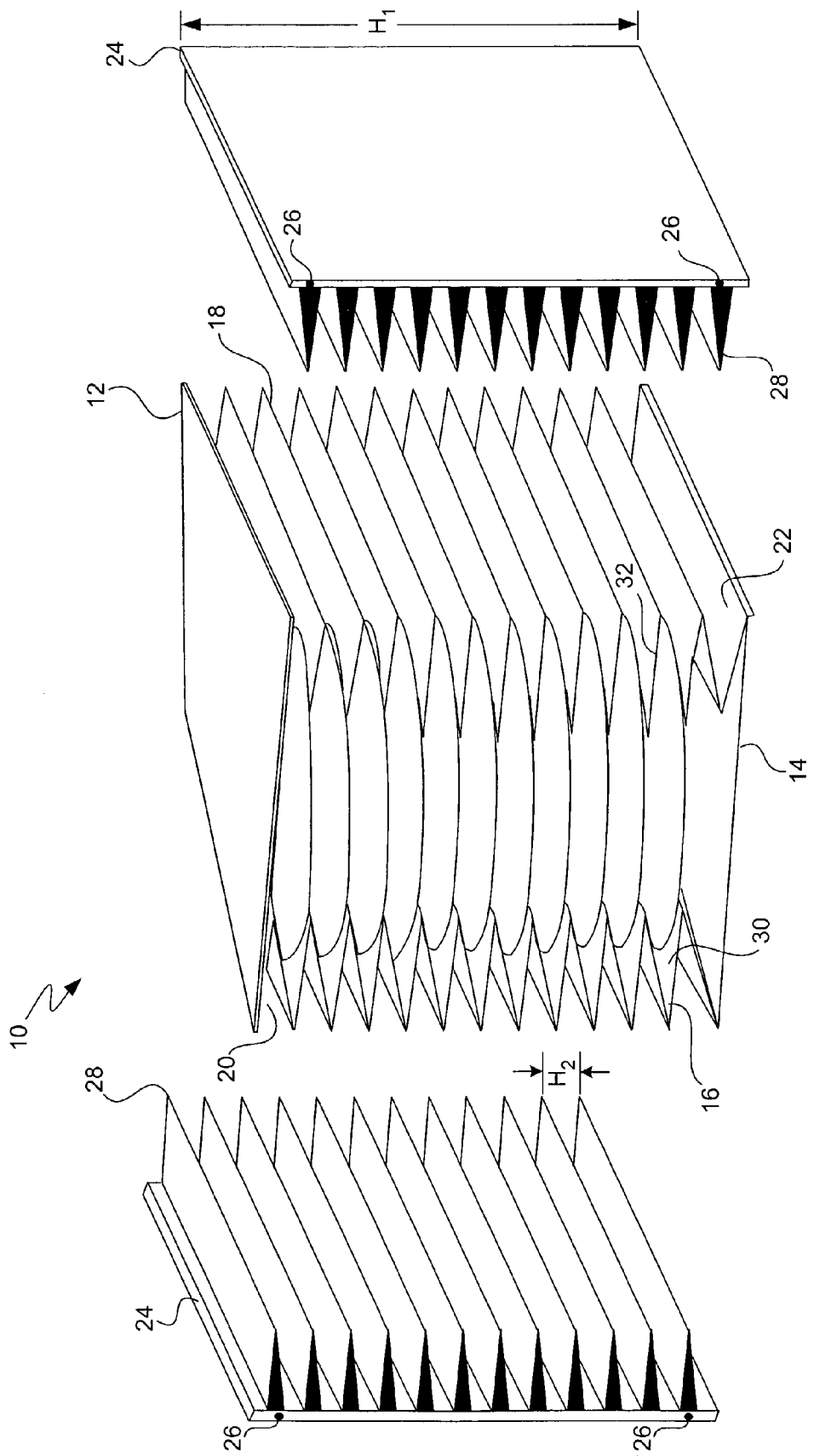
FIG. 1 illustrates an isometric view of a wafer transport assembly constructed in accordance with an embodiment of the invention.

FIG. 1 illustrates a wafer transport assembly 10 constructed in accordance with an embodiment of the invention. The wafer transport assembly 10 includes rigid first and second end plates 12, 14 connected by flexible walls 16, 18. The flexible walls 16, 18 are creased to provide a series of folds 20, 22. In a first embodiment of the invention, removable support jigs 24 are provided with holes 26 and teeth 28. When the support jigs 24 are placed between the end plates 12, 14, the end plates 12, 14 are maintained a predetermined distance $H_1$ from each other, the distance $H_1$ corresponding to the height of the jigs 24. Simultaneously, the teeth 28 insert themselves within each fold 20, 22 so as to space each fold 20, 22 out. This spacing creates a number of interconnected flexible pockets 30, each capable of holding a semiconductor wafer 32 therein.

In operation, the support jigs 24 are placed between the rigid end plates 12, 14. In doing so, teeth 28 are inserted between the folds 20, 22. This stretches out the flexible walls 16, 18, and opens the pockets 30 to a predetermined size, namely the spacing $H_2$ between teeth 28. A semiconductor wafer 32 can then be inserted into the pockets 30. The support jigs 24 are sized to facilitate insertion of the wafers 32. For instance, the height $H_1$ of the support jigs 24, as well as the spacing $H_2$ between teeth 28, can be made identical to corresponding dimensions in other wafer containers used in the fabrication process, to facilitate easy loading from one container or holding device to the assembly 10 of the invention. In addition, holes 26 can be spaced to mate with alignment pins located on other containers, thus facilitating easier attachment to these containers, and easier wafer transfer. Two transport assemblies 10 can thus be connected face to face to facilitate wafer transfer between them, in much the same way as current cassette carriers.

Once wafers 32 are loaded into the pockets 30, the support jigs 24 can be removed from between the end plates 12, 14, allowing the end plates 12, 14 to collapse down onto the wafers 32. In this collapsed state, the end plates 12, 14 assume a compressed position in which they compress the flexible walls 16, 18, and thus the pockets 30, down onto the wafers 32. In this manner, the wafers 32 are affixed within the pockets 30.

The rear of assembly 10 can be left open if there is no risk of wafers sliding out of the pockets 30. Alternatively, additional flexible material may be placed along the rear of assembly 10 to further minimize this risk. For instance, a strip of flexible material can be attached to the rear of end plates 12, 14, or another flexible wall can be provided. In the latter case, a corresponding additional support jig 24 may also be required.

The invention discloses the use of any conventional mechanism of feature to prevent the jigs 24 from prematurely sliding out from between the end plates 12, 14. For instance, the support jigs 24 can be fabricated of a ferrous metal, and magnets can be attached to the inside edges of end plates 12, 14. Additionally, an adhesive can be used to detachably bond the support jigs 24 to the end plates 12, 14, or the edges of end plates 12, 14 and jigs 24 can be designed with snap-fit joints.

The compressed position of the assembly 10 offers advantages over current cassette carriers. First, one of skill in the art can observe that fabricating the flexible walls 16, 18 of a sufficiently thin material allows a collapsed state in which the pockets 30 hold the wafers 32 in much closer proximity to each other than do current cassette carriers. This allows for more compact storage of wafers 32. Second, because the wafers 32 are held in place by a flexible material (i.e., the material of the flexible walls 16, 18), and because the rigid end plates 12, 14 protect the wafers 32 from impact, they are less susceptible to shock than wafers stored in a conventional cassette carrier.

Finally, the assembly 10 can be manufactured of materials that are both inexpensive and compatible with contemporary wafer fabrication environments, allowing the assemblies 10 to be made more cheaply than current cassette carriers. For example, the end plates 12, 14 can be made of any rigid cleanroom-compatible material that also serves to absorb the energy of an impact, such as stainless steel or various inexpensive plastics. Similarly, the flexible walls 16, 18 can be made of inexpensive materials that are conducive to passivated semiconductor wafers (e.g., electrically conductive materials that can act to dissipate static electricity, or simple clean room compatible materials), such as carbon paper. Note that the specific materials mentioned here are shown by way of example and are not meant as limiting. Those of skill in the art will realize that the assembly 10 includes the use of any materials that are compatible with wafer fabrication environments.

Figure 2:
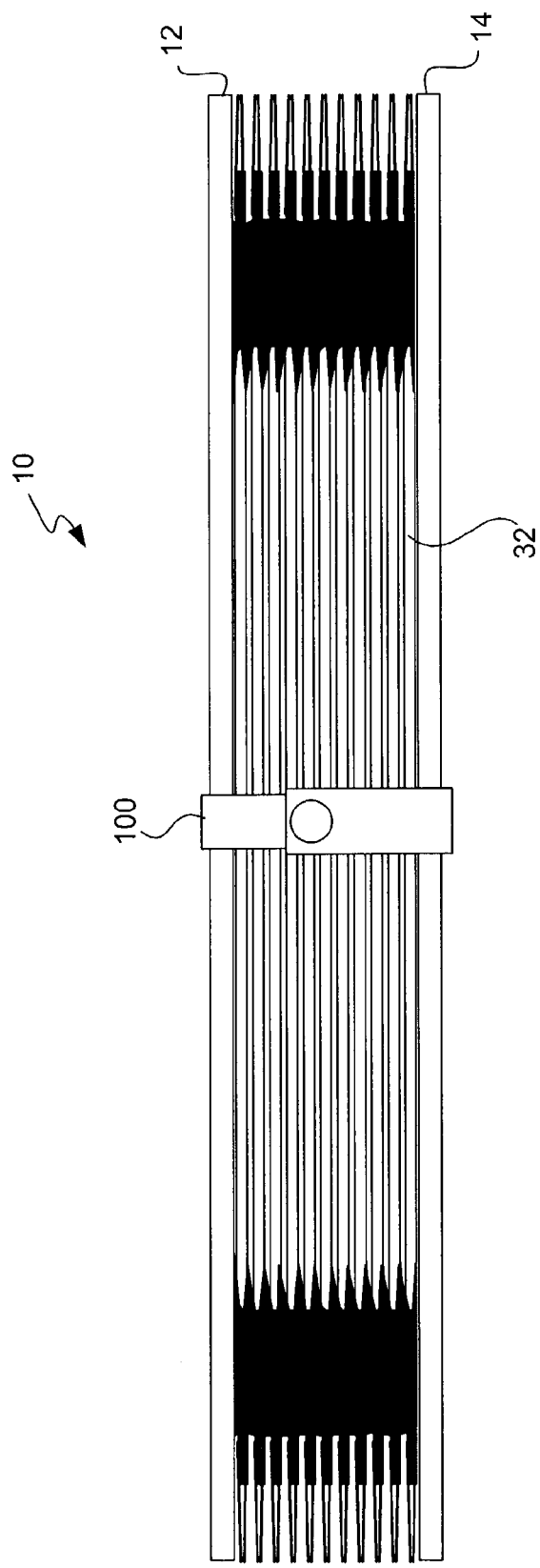
FIG. 2 illustrates a collapsed state of a wafer transport assembly constructed in accordance with an embodiment of the invention

FIG. 2 illustrates a collapsed state of a wafer transport assembly 10 constructed in accordance with an embodiment of the invention. In this embodiment, a clasping mechanism 100 is attached to the end plates 12, 14. When the support jigs 24 are removed and the assembly 10 enters its collapsed state, the wafers 32 are affixed within the pockets 30. The clasping mechanism 100 is then engaged to maintain the end plates 12, 14 in this compressed position, thus securing the wafers 32 within the pockets 30 for transport. One of skill in the art can observe that the collapsed state of assembly 10 acts to store wafers 32 much more compactly than current cassette carriers. Additionally, this collapsed state affixes the wafers 32 within flexible walls 16, 18 that absorb shock and impact more effectively than rigid cassette carriers.

The invention includes the use of any conventional clasp, including buttons, adhesive strips, and snaps, as the clasping mechanism 100. In addition, the clasping mechanism can be permanently affixed to the end plates 12, 14, or separately attachable. As an example of the latter, the clasping mechanism 100 can be an elastic strip that stretches around the end plates 12, 14, or a C-clamp.

Figure 3:
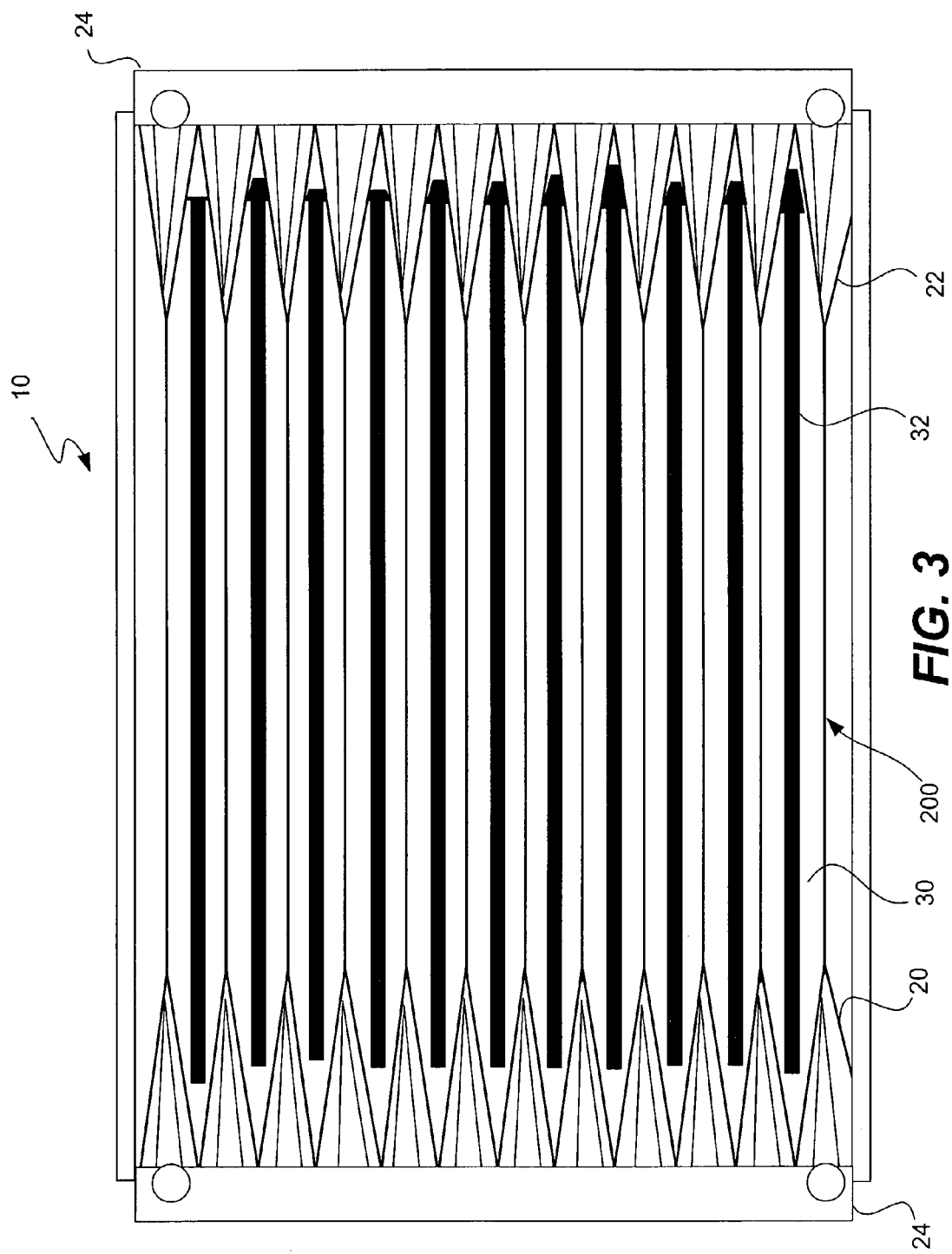
FIG. 3 illustrates a front view of a wafer transport assembly constructed in accordance with an embodiment of the invention.

FIG. 3 illustrates a front view of a wafer transport assembly 10 constructed in accordance with an embodiment of the invention. In some instances, it is desirable to fully enclose wafers during transport, so as to ensure that individual wafers do not contact each other and cause the destruction of their various integrated circuits. In order to fully enclose wafers, the assembly 10 of this embodiment of the invention includes protective material 200 connecting the folds 20, 22. When wafers 32 are inserted into the pockets 30, the folds 20, 22 and protective material 200 completely surround the wafers 32. One of skill in the art will observe that, when the support jigs 24 are removed and the assembly 10 enters its collapsed state, the wafers 32 are fully enclosed within the pockets 30, and are thus prevented from contacting each other during handling or transport.

It should be noted that the invention is not limited to embodiments in which the support jigs 24 are removable from between the end plates 12, 14. Rather, the invention includes embodiments in which the support jigs 24 are made from compressible materials. In some such embodiments, the support jigs 24 need not be removed prior to collapsing the end plates 12, 14. Instead, the support jigs 24 can be designed to maintain the end plates 12, 14 at a predetermined distance from each other when uncompressed, but also to collapse down along with the end plates 12, 14 when pressure is applied. In this manner, the assembly 10 can comprise a single, integrated assembly that has no removable parts.

Similarly, it should also be noted that the invention includes the simultaneous use of various aspects of different embodiments. For instance, the assembly 10 can be designed as a single, integrated assembly with compressible support jigs 24 and a clasping mechanism 100. In this manner, once the end plates 12, 14 are compressed to affix wafers 32 within the pockets 30, the clasping mechanism 100 can be engaged to maintain this compressed position for easier wafer transport.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An assembly to facilitate the transport of semiconductor wafers, said assembly comprising:
   rigid first and second end plates;
   a plurality of interconnected flexible pockets configured to be provided between said first and second end plates; and
   a plural of jigs configured to be located between the first and second end plates and each of the plurality of interconnected flexible pockets, each jig including a plurality of teeth configured for insertion between said pockets to engage and open each of said pockets so that semiconductor wafers may be inserted into the plurality of interconnected flexible pockets respectively.

2. The assembly of claim 1 wherein said plurality of interconnected flexible pockets is configured to collapse into a collapsed state.

3. The assembly of claim 2 further comprising a clasping mechanism configured to maintain said collapsed state.

4. The assembly of claim 2 wherein the plurality of jigs are further configured to remain between said first and second end plates after said plurality of interconnected pockets enters said collapsed state.

5. The assembly of clam 1, wherein said plurality of interconnected pockets is comprised of an electrically conductive material.

6. The assembly of claim 1 wherein said each of said pockets is configured to fully enclose a semiconductor wafer therein.

7. The assembly of claim 2, wherein the plurality of jigs are further configured to be removed prior to collapsing the plurality of interconnected flexible pockets into the collapsed state.

* * * * *

UNITED STATES PATENT AND TRADEMARK OFFICE
CERTIFICATE OF CORRECTION

PATENT NO. : 6,981,594 B1
APPLICATION NO. : 10/463974
DATED : January 3, 2006
INVENTOR(S) : Roger P. Sarver It is certified that error appears in the above-identified patent and that said Letters Patent is hereby corrected as shown below:

Column 2, line 52, change "mechanism of feature" to -- mechanism or feature --.

In line 7 of claim 1 (column 4, line 37) change "a plural" to -- a plurality --.

Signed and Sealed this

Twelfth Day of September, 2006

JON W. DUDAS
*Director of the United States Patent and Trademark Office*